United States Patent
Lee et al.

(10) Patent No.: US 6,479,865 B1
(45) Date of Patent: Nov. 12, 2002

(54) SOI DEVICE AND METHOD OF FABRICATING THE SAME

(75) Inventors: Won Chang Lee, Seoul (KR); Woo Han Lee, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/595,107

(22) Filed: Jun. 16, 2000

(30) Foreign Application Priority Data

Jun. 28, 1999 (KR) .............................. 99-24612

(51) Int. Cl.⁷ .............................................. H01L 27/01
(52) U.S. Cl. ........................ 257/347; 257/349; 257/352; 257/353; 257/354
(58) Field of Search ................................ 257/347, 349, 257/352–354

(56) References Cited

U.S. PATENT DOCUMENTS

| | | | |
|---|---|---|---|
| 5,024,965 A | | 6/1991 | Chang et al. |
| 5,120,667 A | * | 6/1992 | Tarui et al. .................... 437/40 |
| 5,140,390 A | | 8/1992 | Li et al. |
| 5,496,764 A | | 3/1996 | Sun |
| 5,719,081 A | | 2/1998 | Racanelli et al. |
| 5,850,090 A | | 12/1998 | Oashi et al. |
| 5,893,728 A | | 4/1999 | Hidaka |
| 5,973,364 A | | 10/1999 | Kawanaka |
| 6,040,090 A | * | 5/2000 | Miyamoto et al. .......... 257/347 |
| 6,064,090 A | * | 5/2000 | Miyamoto et al. .......... 257/354 |
| 6,168,979 B1 | * | 1/2001 | Kim et al. ................... 438/151 |
| 6,180,985 B1 | * | 1/2002 | Yeo .............................. 437/40 |
| 6,190,952 B1 | * | 2/2002 | Xiang et al. ................ 438/155 |
| 6,194,289 B1 | * | 2/2002 | Lee ............................. 438/450 |

FOREIGN PATENT DOCUMENTS

JP 9-181077 * 7/1997

* cited by examiner

*Primary Examiner*—Nathan J. Flynn
*Assistant Examiner*—Ahmed N. Sefer
(74) *Attorney, Agent, or Firm*—Pillsbury Winthrop LLP

(57) ABSTRACT

Disclosed are an SOI device having no edge leakage current and a method of fabricating the same. The SOI device comprises: an SOI substrate of a stack structure of a base substrate, a buried oxide layer and a semiconductor layer; an oxide layer formed to be in contact with the buried oxide layer at the semiconductor layer portion corresponding to a field region so that an active region is defined; a gate electrode pattern having a gate oxide layer, the gate oxide layer only formed on the active region; a source region and a drain region formed inside the active region of the semiconductor layer of both sides of the gate electrode pattern; and a gate electrode line formed on the gate electrode pattern and on the field region so as to interconnect the gate electrode patterns of the respective active regions arranged in a line.

2 Claims, 10 Drawing Sheets

SOI DEVICE AND METHOD OF FABRICATING THE SAME

BACKGROUND OF THE INVENTION

1. Field of the Invention

The present invention relates to a silicon-on-insulator ("SOI") device and a method of fabricating the same, particularly to an SOI device and the method of fabricating the same capable of preventing from generating leakage current at edges of an active region.

2. Description of the Related Art

As the semiconductor device has progressed with highly enhanced performance, there has been watched a semiconductor integration technology employing, instead the silicon substrate of bulk silicon, an SOI substrate of stack structure consisting of a base substrate, a buried oxide layer and a semiconductor layer. This is because the device formed on the SOI substrate(hereinafter "an SOI device") compared to the conventional device, has advantages likewise faster operation speed due to small junction capacitance, lower voltage due to low threshold voltage and a latch-up removal due to a complete device isolation.

Meanwhile, an isolation step during the manufacturing process of the SOI device for defining active regions is conducted as the LOCOS method or the trench method. In addition, the isolation step is also conducted as the MESA isolation method that a semiconductor layer corresponding to a field region is etched to the buried oxide layer.

Hereinafter, an SOI device and a method of fabricating the same obtained according to the MESA isolation method will be described with reference to FIGS. 1 and 2. Herein, FIG. 1 is its plane view, and FIG. 2 is a cross-sectional view taken along the line II–II' of FIG. 1 to illustrate the fabricating method.

Referring to FIG. 1, an active region AR is defined by etching a semiconductor layer portion 3 corresponding to a field region FR so that the active region AR is formed in shape of an island. A gate electrode 12 is provided in shape of lines, and active regions neighboring in their vertical or horizontal directions are interconnected by the gate electrode 12.

Referring to FIG. 2, an SOI substrate 10 of stack structure consisting of a base substrate 1, a buried oxide layer 2 and a semiconductor layer 3 is provided. The SOI substrate 10 includes an active region AR and a device isolation region FR, the active region AR is defined by etching a semiconductor layer portion corresponding to the field region FR to a buried oxide layer 2. A gate electrode 12 having a gate oxide layer 11 is formed on a resultant such that the gate electrode 12 covers the edges of the active region AR.

However, the conventional SOI device manufactured according to the MESA isolation method increases leakage current because the gate electrode surrounds edges of the active region AR. As a result, operation speed of the device is degraded.

More particularly, the conventional SOI device manufactured according to the MESA isolation method as shown in FIG. 2 is formed in the shape that the gate electrode surrounds edges of the active region AR. In this case, when a selected voltage is applied to the gate electrode 12, an electric field owing to the gate electrode 12 is concentrated onto the edges of the active region AR. However, the concentration at the edges of the active region AR causes a phenomenon that a channel formed at edges of the active region AR is turned-on earlier than a channel formed inside the active region. As a result, the off-leakage current is increased, thereby degrading the device property.

FIG. 3 is a graph showing VG-ID curve of the above-identified SOI device. In the drawing, the full-line is a real VG-ID curve including the edge effect, and the dotted line is a VG-ID curve excluding the edge effect.

Referring to FIG. 3, there is appeared a hump since the channel formed at edges of the active region AR is turned-on earlier than the channel formed inside the active region. In comparison of the off-leakage current at $V_{GS}$=0 V, the leakage current on a certain occasion occurring the edge effect, is greater than that of the leakage current on an occasion not occurring the edge effect.

Therefore, when an SOI device is formed according to the MESA isolation method, the essential objective to be solved is to prevent increase of the leakage current due to the edge effect so that the degradation of the device property is prevented.

SUMMARY OF THE INVENTION

It is the object of the present invention to provide an SOI device having no edge leakage current.

It is another object of the present invention to provide a method of fabricating an SOI device having no edge leakage current.

An SOI device to accomplish the foregoing objectives includes: an SOI substrate of a stack structure of a base substrate, a buried oxide layer and a semiconductor layer; an oxide layer formed to be in contact with the buried oxide layer at the semiconductor layer portion corresponding to a field region so that an active region is defined; a gate electrode pattern having a gate oxide layer, the gate oxide layer only formed on the active region; a source region and a drain region formed inside the active region of the semiconductor layer of both sides of the gate electrode pattern; and a gate electrode line formed on the gate electrode pattern and on the field region so as to interconnect the gate electrode patterns of the respective active regions arranged in a line.

The method of fabricating the SOI device according to the object of the present invention includes the steps of: providing an SOI substrate of a stack structure of a base substrate, a buried oxide layer and a semiconductor layer; forming successively a gate oxide layer and a first conduction layer on the semiconductor layer; etching the gate oxide layer portion, the gate oxide layer corresponding to a field region and the gate oxide layer so that an active region is defined; depositing an oxide layer on a resultant; polishing the oxide layer until the etched first conduction layer is exposed; depositing a second conduction layer on the etched first conduction layer and on the polished oxide layer; forming a mask pattern in shape of a line on the second conduction layer; forming a gate electrode pattern only formed on the active region by etching the second conduction layer, the etched first conduction layer and the gate oxide layer with using the mask pattern, and a gate electrode line interconnecting the gate electrode patterns of the respective neighboring active regions arranged in a line; and forming source and drain regions inside the semiconductor layer portions of both edges of the gate electrode line.

Moreover, another method of fabricating the SOI device according to the objective of the present invention includes the steps of: providing an SOI substrate of a stack structure of a base substrate, a buried oxide layer and a semiconductor layer; forming successively a gate oxide layer and a first conduction layer on the semiconductor layer; patterning the first conduction layer and the gate oxide layer to form a conduction line; forming source and drain regions inside the semiconductor layer portions of both sides of the conduction line; etching the conduction line having the gate oxide layer on a field region and the semiconductor layer to define an active region, thereby forming a gate electrode pattern only on the active region; depositing an oxide layer on a resultant; polishing the oxide layer until the gate electrode pattern is exposed; and forming a gate electrode line interconnecting gate electrode patterns formed at the respective neighboring active regions arranged in a line.

BRIEF DESCRIPTION OF THE DRAWINGS

The objects and advantages of the present invention may be more readily understood with reference to the attached detailed descriptions taken in conjunction with the accompanying drawings.

DETAILED DESCRIPTION OF THE INVENTION

Hereinafter, the preferred embodiment of the present invention will now be made with reference to the attached drawings FIGS. 4A to 4F.

Figure 1:
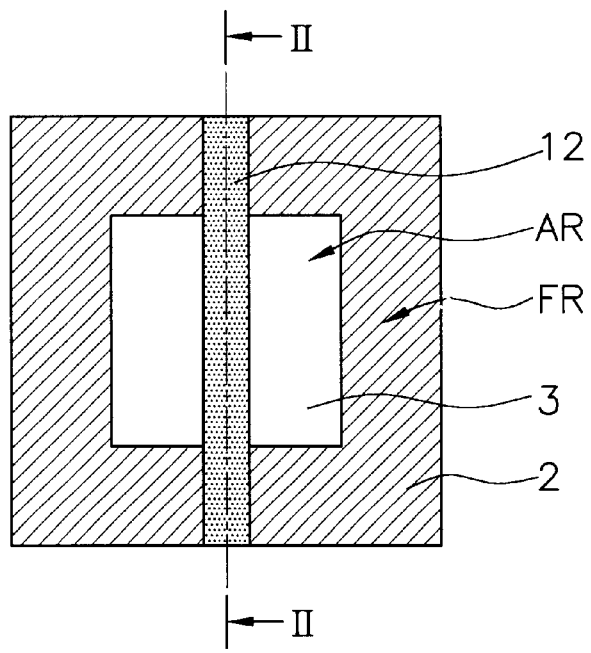
FIG. 1 is a plane view of an SOI device manufactured according to a conventional MESA isolation method.
Figure 2:
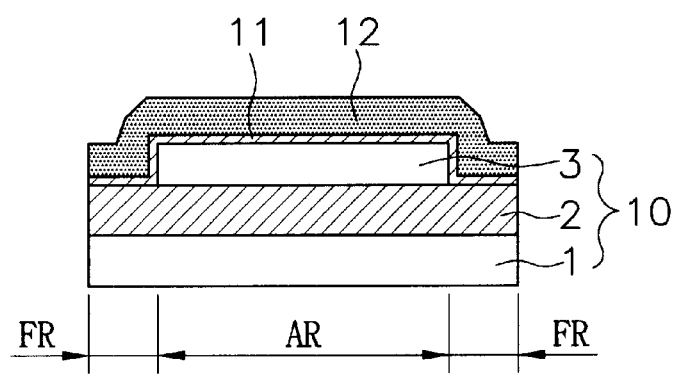
FIG. 2 is a cross-sectional view taken along the line II–II' of FIG. 1 illustrating the method of fabricating the SOI device.
Figure 3:
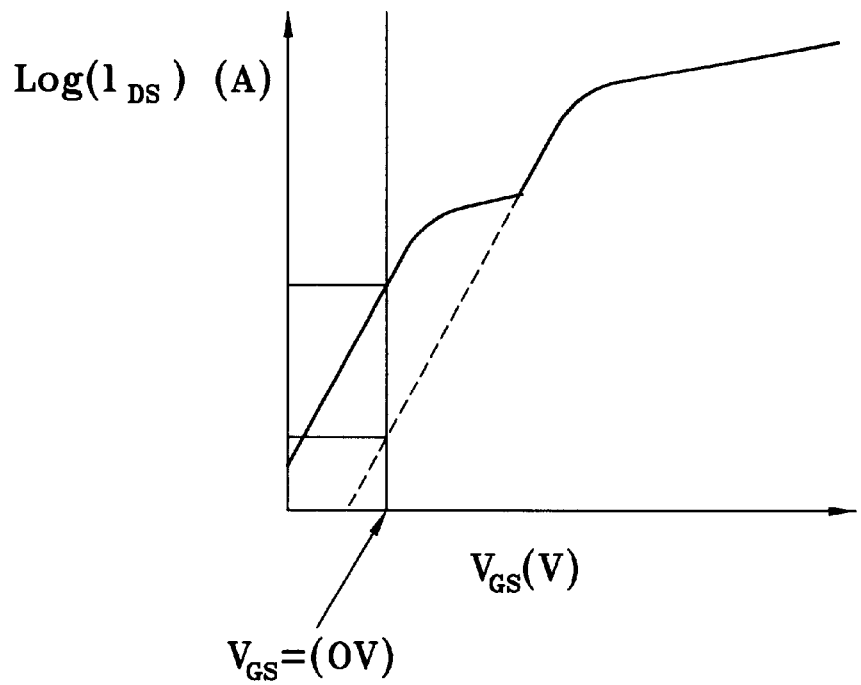
FIG. 3 is a VG-ID curve showing the variation of drain current to the gate voltage.
Figure 4A:
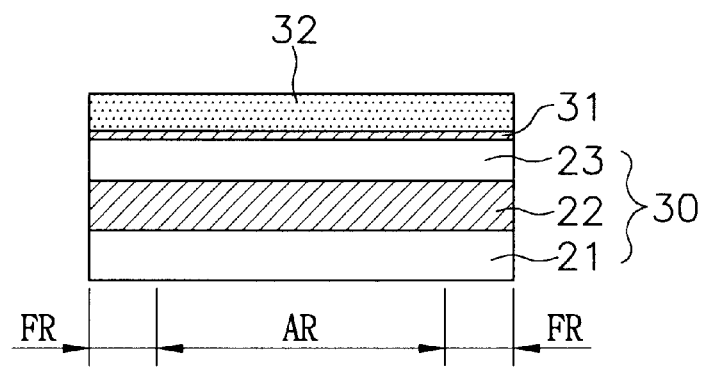
FIGS. 4A to 4F are cross-sectional views for showing a method of fabricating the method of SOI device according to one embodiment of the present invention.

Referring to FIG. 4A, there is provided an SOI substrate 30 of a stack structure consisting of a base substrate 21 for supporting the entire body, a buried oxide layer 22 providing a complete device isolation and formed on the base substrate 21, and a semiconductor layer 23 providing an active region disposed on the buried oxide layer 22. The SOI substrate 30 includes an active region AR and a field region FR. The semiconductor layer 23 is preferably formed with thickness of 100~5,000Å. A gate oxide layer 31 is formed on the semiconductor layer 23, a first conduction layer 32 is deposited on the gate oxide layer 31. The first conduction layer 32 is a polysilicon layer, preferably.

Figure 4B:
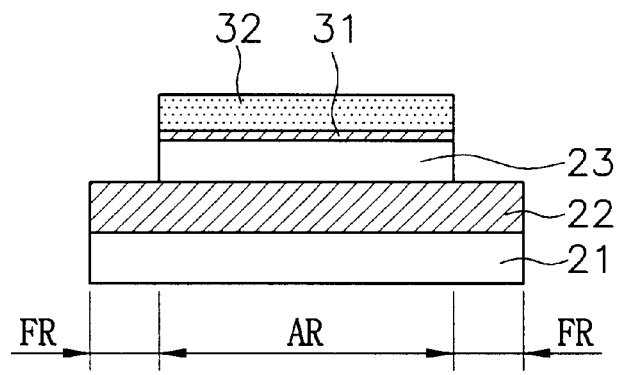
Figure 5:
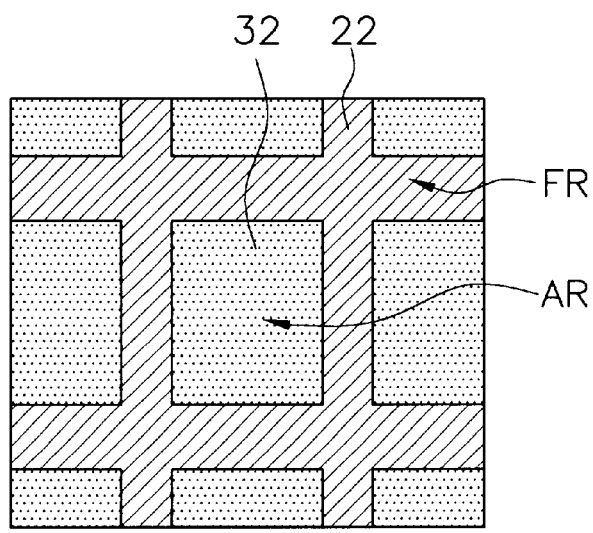
FIG. 5 is a plane view corresponding to FIG. 4B.

Referring to FIG. 4B, the active region AR in which a device is formed, is defined by an MESA isolation method that the first conduction layer portion, the gate oxide layer portion and the semiconductor layer portion, all formed on the field region FR are etched until the buried oxide layer 22 is exposed. FIG. 5 is a plane view corresponding to FIG. 4B, as shown in the drawings, the etched first conduction layer 32 is only remained on the active region AR.

Figure 4C:
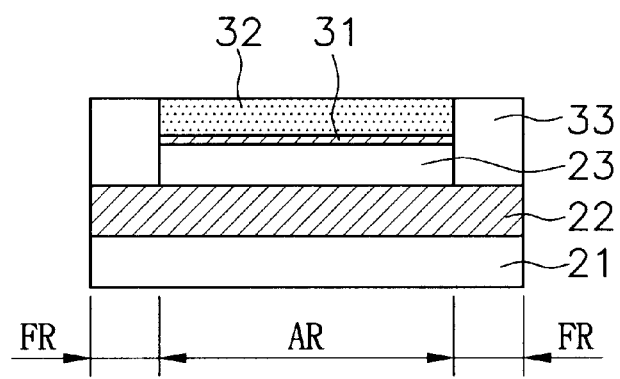

Referring to FIG. 4C, an oxide layer 33 is deposited on the above resultant with a sufficient thickness to completely cover the etched first conduction layer 32. And then, the polished oxide layer 33 is polished by the chemical mechanical polishing("CMP") process until the etched first conduction layer 32 is exposed. As a result, the oxide layer 33 is only remained on the field region FR.

Figure 4D:
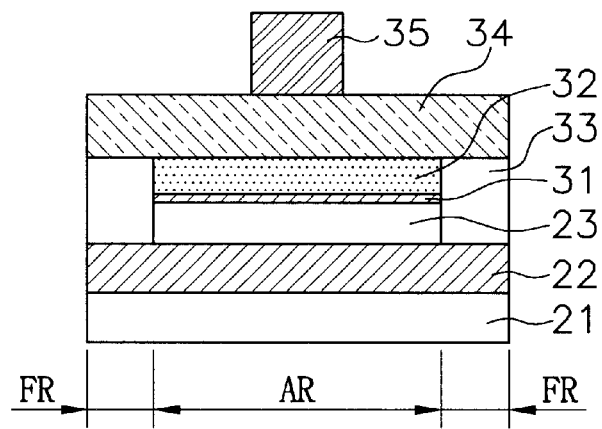

Referring to FIG. 4D, a second conduction layer 34 is deposited on the polished oxide layer 33 and on the etched first conduction layer 32. Herein, the second conduction layer 34 is made of the same or different material as that of the first conduction layer 32. For example, when the first conduction layer 32 is formed of the polysilicon layer, the second conduction layer 34 is preferably formed of a metal silicide layer. A mask pattern 35 made of photoresist is formed on the second conduction layer 34 in shape of a line.

Figure 4E:
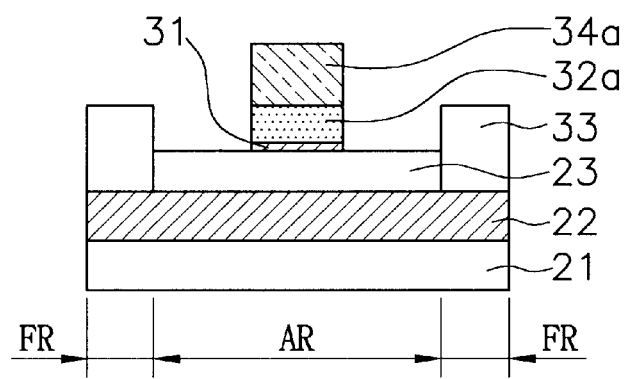

Referring to FIG. 4E, a gate electrode line 34a and a gate electrode pattern 32a are formed by etching the second conduction layer 34, the first conduction layer 32 and the gate oxide layer 31. Afterward, the mask pattern used as an etching mask is removed.

Figure 6A:
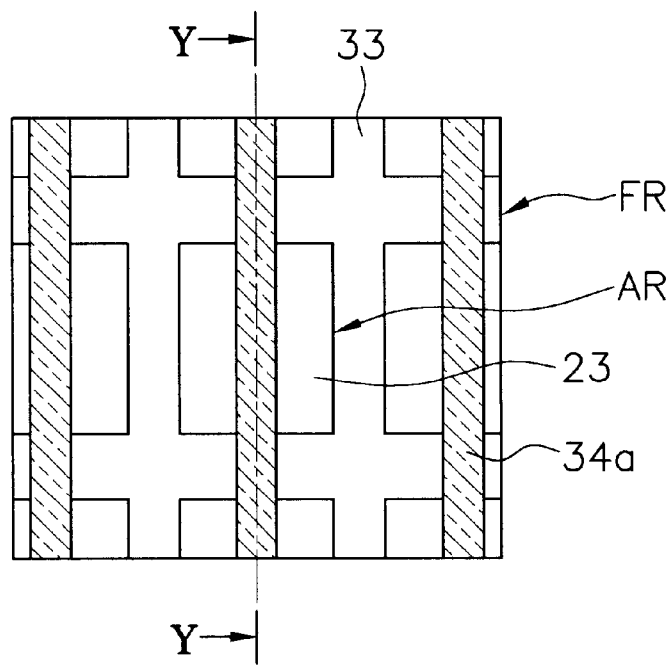
FIG. 6A is a plane view corresponding to FIG. 4E.
Figure 6B:
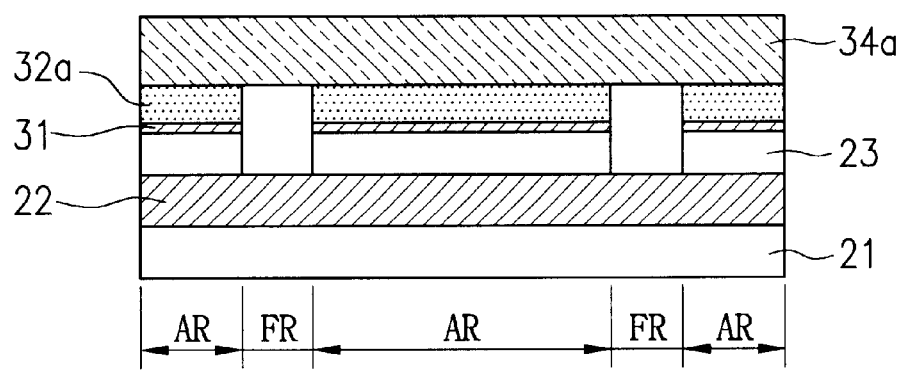
FIG. 6B is a cross-sectional view taken along the line Y–Y' of FIG. 6A.

Herein, the gate electrode pattern 32a is only disposed on the active region AR since the gate electrode pattern 32a is formed by etching the first conduction layer remained on the active region AR. In the mean time, the gate electrode line 34a is disposed at the gate electrode pattern 32a as well as on the field region FR so that gate electrode patterns formed at the respective neighboring active regions AR arranged in a line are interconnected to each other.(Refer to FIGS. 6A and 6B)

Figure 4F:
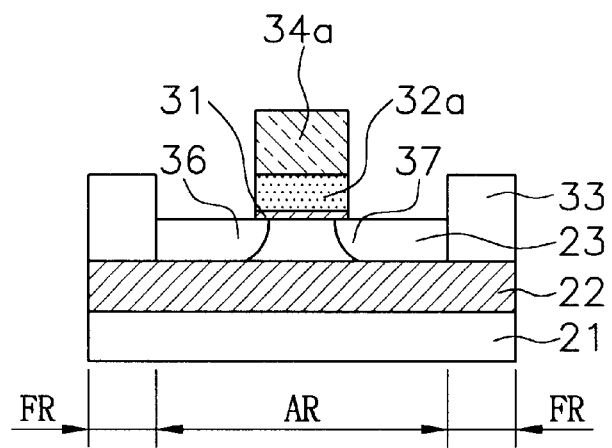

Referring to FIG. 4F, source and drain regions 36,37 are formed inside the semiconductor layer portions of both edges of the gate electrode line by an implantation process which employs the gate electrode line 34a as a mask. As a result, an SOI device such as a transistor is completed.

In the SOI device fabricated by the above-described procedures, the gate electrode consisting of the gate electrode pattern and the gate electrode line is formed at the active region and not to surround the edges of the active region. As a result, there is no the leakage current that is caused by previously turning-on the channel of edge in the active region. Accordingly, the SOI device according to the present invention can prevent increase of the off-leakage current due to the edge effect, and as a result the property and reliability of the device is improved.

FIGS. 7A to 7E are cross-sectional views for showing a method of fabricating an SOI device according to another embodiment of the present invention. Herein, like reference numerals designate like structural elements of the previous embodiment.

Figure 7A:
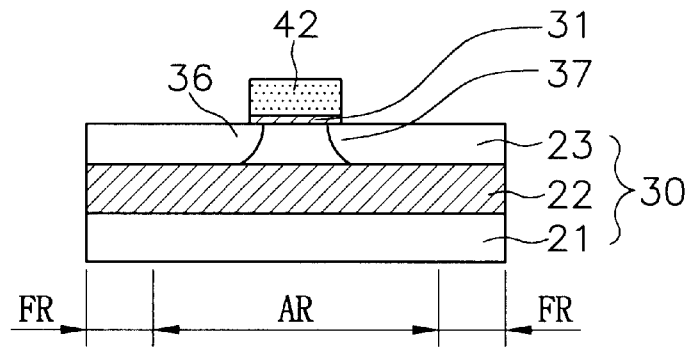
FIGS. 7A to 7E are cross-sectional views for showing a method of fabricating an SOI device according to another embodiment of the present invention.
Figure 8:
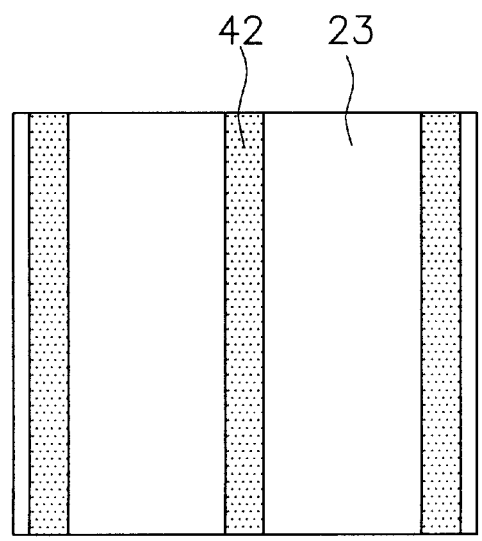
FIG. 8 is a plane view corresponding to FIG. 7A.

Referring to FIG. 7A, an SOI substrate 30 of a stack structure consisting of a base substrate 21, a buried oxide layer 22 and a semiconductor layer 23, is provided, and a gate oxide layer 31 and a first conduction layer 42 are deposited on the semiconductor layer 23 successively. The first conduction layer 42 and the gate oxide layer 31 are patterned to have a line form. (Refer to FIG. 8)

Source and drain regions 36,37 are formed inside the semiconductor layer of both edges of the first conduction layer 42 by an implantation process using the patterned first conduction layer 42.

Figure 7B:
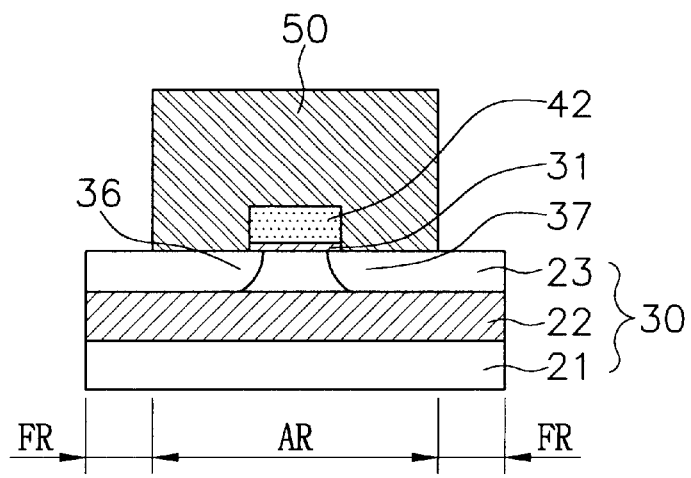

Referring to FIG. 7B, a mask pattern 50 made of photoresist is formed on the above resultant to cover an active region AR.

Figure 7C:
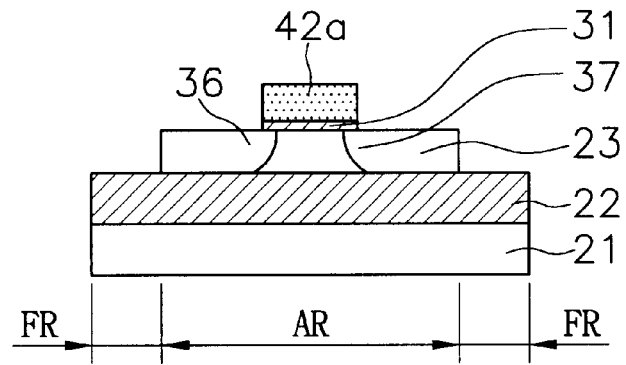

Referring to FIG. 7C, the active region AR is defined by etching the exposed semiconductor layer portion until the buried oxide layer 22 is exposed. During the etching step, portions of the first conduction layer and the gate oxide layer onto field region FR are etched together, thereby forming a gate electrode pattern 42a only on the active region AR. Afterward, the mask pattern is removed.

Figure 9:
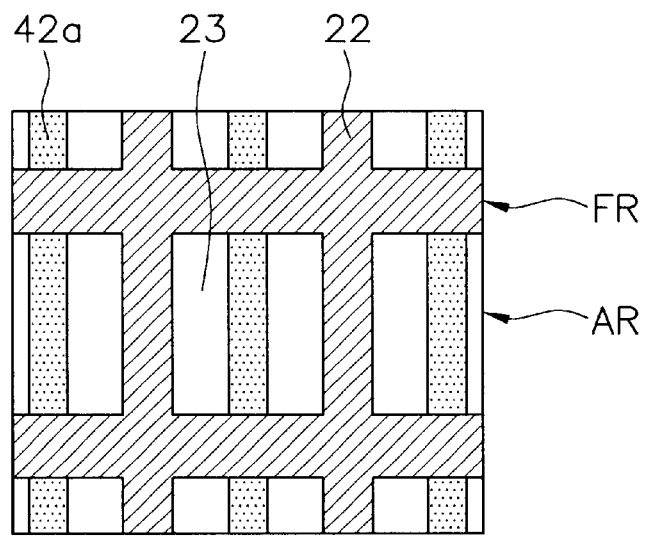
FIG. 9 is a plane view corresponding to FIG. 7C.
Figure 10:
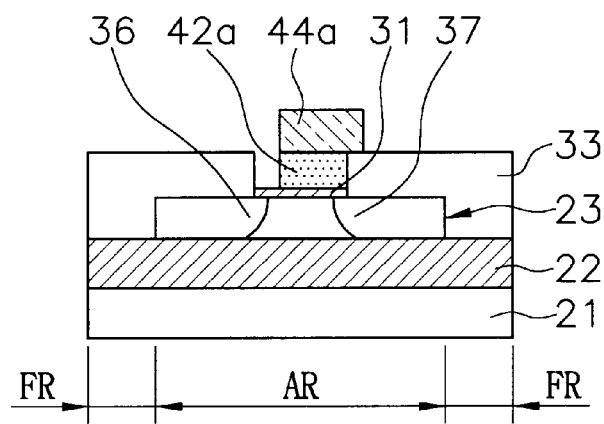
FIG. 10 is a cross-sectional view for showing an abnormal arrangement between the gate electrode line and gate electrode patterns formed according to the other embodiment of the present invention.

FIG. 9 is a plane view corresponding to FIG. 7C for showing results of the above described etching step. As shown in the drawing, the gate electrode pattern 42a is only formed on the active region AR.

Figure 7D:
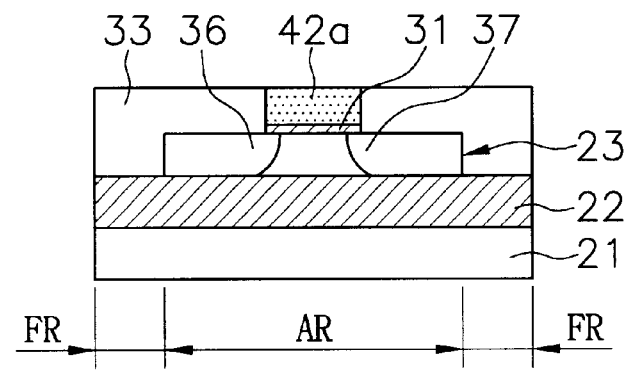

Referring to FIG. 7D, an oxide layer 33 is deposited on the resultant, and then polished by the CMP process until the gate electrode pattern 42a is exposed.

Figure 7E:
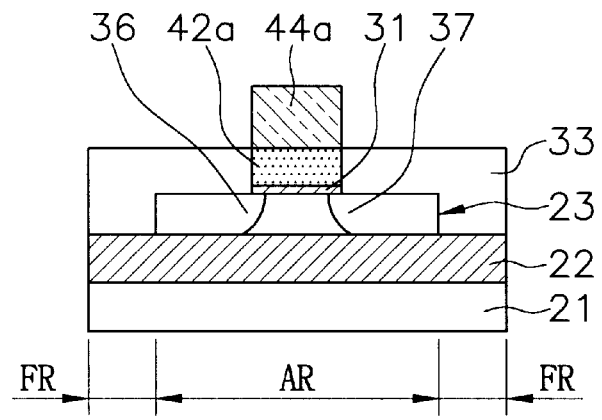

Referring to FIG. 7E, a second conduction layer is deposited on the resultant and a gate electrode line 44a is formed by patterning the second conduction layer. Similar to the previous embodiment, the gate electrode line 44a is formed to interconnect gate electrode patterns formed at the respective neighboring active regions AR arranged in a line.

The gate electrode line 44a can be made of a different material from that of the gate electrode pattern 42a. For example, when the gate electrode pattern 42a is made of polysilicon layer, the gate electrode line 44a is preferably made of a metal silicide layer.

Further, the gate electrode line 44a can be made of a material identical to that of the gate electrode pattern 42a. In this case, due to a misalignment during the etching step for forming the gate electrode line 44a, the gate oxide layer 31 may be exposed, then the device reliability is degraded. Accordingly, when the gate electrode line 44a is made of the same material as the gate electrode pattern 42a, width of the gate electrode line 44a is preferably wider than that of the gate electrode pattern 42a so that the exposing of the gate oxide layer 31 since the mis-alignment is prevented.

As described in the above description section, the gate electrode in the present invention is only disposed on the active region and does not surround the edges of the active region, thereby preventing the leakage current generation caused by the edge effect. Therefore, increase of the off-leakage current is prevented and property and reliability of the device is also improved.

Various other modifications can be readily devised by those skilled in the art without departing from the scope of the invention.

What is claimed is:

1. A Silicon-on-Substrate ("SOI") device comprising:

an SOI substrate of a stack structure of a base substrate, a buried oxide layer and a semiconductor layer;

an oxide layer formed to be in contact with the buried oxide layer at the semiconductor layer portion corresponding to a field region so that an active region is defined;

a gate electrode pattern having a gate oxide layer, the gate oxide layer only formed on the active region;

a source region and a drain region formed inside the active region of the semiconductor layer of both sides of the gate electrode pattern; and a gate electrode line formed on the gate electrode pattern and on the field region so as to interconnect the gate electrode patterns of the respective active regions arranged in a line, wherein the gate electrode pattern and the gate electrode line are made of the same material, and wherein the gate electrode line has a wider width than that of the gate electrode pattern.

2. A Silicon-on-Substrate ("SOI") device comprising:

an SOI substrate comprising a stacked structure of a base substrate, a semiconductor layer, and a buried oxide layer separating the base substrate and the semiconductor layer;

an oxide structure extending through the semiconductor layer and contacting the buried oxide layer, the oxide structure comprising a plurality of field regions that define and separate a first and second active region within the semiconductor layer;

a gate oxide layer formed on an upper surface of each of the active regions;

a gate electrode pattern comprising a conductive material formed on each of the gate oxide layers;

a source region and a drain region formed in each of the active regions on opposite sides of the gate electrode pattern; and a gate electrode line comprising the conductive material extending over a portion of the oxide structure separating the first and second active regions, and providing electrical contact between the gate electrode pattern in the first active region and the gate electrode pattern in the second active region, wherein:

the gate electrode pattern is characterized by a width $W_1$;

the gate electrode line is characterized by a width $W_2$; and $W_2 > W_1$.

* * * * *